(12) United States Patent
Poonawala et al.

(10) Patent No.: US 8,010,913 B2
(45) Date of Patent: Aug. 30, 2011

(54) MODEL-BASED ASSIST FEATURE PLACEMENT USING INVERSE IMAGING APPROACH

(75) Inventors: Amyn A. Poonawala, Portland, OR (US); Benjamin D. Painter, Portland, OR (US); Levi D. Barnes, Hillsboro, OR (US)

(73) Assignee: Synopsys, Inc., Moountain View, CA (US)

( * ) Notice: Subject to any disclaimer, the term of this patent is extended or adjusted under 35 U.S.C. 154(b) by 317 days.

(21) Appl. No.: 12/386,199

(22) Filed: Apr. 14, 2009

(65) Prior Publication Data

US 2010/0262946 A1    Oct. 14, 2010

(51) Int. Cl.
*G06F 17/50* (2006.01)

(52) U.S. Cl. ............... 716/50; 716/53; 716/54; 716/55

(58) Field of Classification Search ............ 716/50
See application file for complete search history.

(56) References Cited

U.S. PATENT DOCUMENTS

| | | |
|---|---|---|
| 2006/0200790 A1 | 9/2006 | Shang |
| 2007/0198963 A1 | 8/2007 | Granik |
| 2007/0262947 A1 | 11/2007 | Wang |
| 2008/0124906 A1 | 5/2008 | Moon |

OTHER PUBLICATIONS

G.M.P Van Kempen et al., "The influence of the background estimation on the superresolution properties of non-linear image restoration algorithms," In: Proc. SPIE, Three-Dimensional and Multidimensional Microscopy: Image Aquisition and Processing VI, Jan. 1999, vol. 3605, pp. 179-189.

*Primary Examiner* — Vuthe Siek
*Assistant Examiner* — Eric Lee
(74) *Attorney, Agent, or Firm* — Park, Vaughan, Fleming & Dowler LLP; Laxman Sahasrabuddhe (57) ABSTRACT

Some embodiments provide techniques and systems to identify locations in a target mask layout for placing assist features. During operation, an embodiment can determine a spatial sampling frequency to sample the target mask layout, wherein sampling the target mask layout at the spatial sampling frequency prevents spatial aliasing in a gradient of a cost function which is used for computing an inverse mask field. Next, the system can generate a grayscale image by sampling the target mask layout at the spatial sampling frequency. The system can then compute the inverse mask field by iteratively modifying the grayscale image. The system can use the gradient of the cost function to guide the iterative modification process. Next, the system can filter the inverse mask field using a morphological operator, and use the filtered inverse mask field to identify assist feature locations in the target mask layout.

21 Claims, 5 Drawing Sheets
(2 of 5 Drawing Sheet(s) Filed in Color)

MODEL-BASED ASSIST FEATURE PLACEMENT USING INVERSE IMAGING APPROACH

FIELD

This disclosure generally relates to electronic design automation. More specifically, the disclosure relates to methods and apparatuses for model-based assist feature placement using an inverse imaging approach.

BACKGROUND

Related Art

Rapid advances in computing technology have made it possible to perform trillions of computational operations each second on data sets that are sometimes as large as trillions of bytes. These advances can be attributed to the dramatic improvements in semiconductor design and manufacturing technologies which have made it possible to integrate tens of millions of devices onto a single chip.

One such technology involves placing assist features in a mask layout. Note that assist features can be printing (e.g., super-resolution assist features) or non-printing (e.g., sub-resolution assist features). In either case, assist features are meant to improve the through process window of the patterns on the mask layout that are intended to be printed on the wafer.

Some conventional techniques for placing assist features use design rules, which place and size assist features based on combinations of feature width and spacing parameters. Unfortunately, at smaller technology nodes, rule-based approaches can result in missed or sub-optimal placement and/or dimensioning of assist features. Additionally, large and complex layouts can require a large number of design rules, which can be very difficult to manage. Moreover, design rules can be overly restrictive which can prevent designers from being able to achieve the best device performance.

Some conventional techniques use techniques based on ILT (inverse lithography technology). Unfortunately, the conventional ILT-based approaches suffer from a number of shortcomings. Specifically, conventional ILT-based techniques usually cannot accurately represent all patterns in the mask layout, require unreasonably large amounts of computational time and resources, and result in asymmetric assist feature placements. Hence, it is generally desirable to determine assist feature locations without the above-described drawbacks.

SUMMARY

Some embodiments of the present invention provide systems and techniques that determine locations for placing assist features in a mask layout using an inverse imaging approach. Specifically, a system can represent the mask layout using a coarse grayscale image, and can compute an inverse mask field by iteratively modifying the grayscale image. The system can then use the inverse mask field to determine assist feature locations.

Note that the system typically uses the gradient of a cost function to guide the iterative modification process. In some embodiments, the cost function can represent a difference between the mask layout and an aerial image that would be formed by the inverse mask field if the inverse mask field were subjected to a photolithography process.

During operation, the system can determine a spatial sampling frequency to sample the target mask layout, wherein sampling the target mask layout at the spatial sampling frequency prevents spatial aliasing in the gradient of the cost function. Next, the system can generate an anti-aliased grayscale image by sampling the target mask layout at the spatial sampling frequency. The system can then compute the inverse mask field by, iteratively, using the gradient of the cost function to modify the grayscale image, and updating the gradient of the cost function based at least on the modified grayscale image. Once the iterative process terminates, the system can identify locations for placing assist features based at least on the computed inverse mask field.

In some embodiments, the system can apply a morphological operator to the inverse mask field to filter out noise at locations in the inverse mask field where assist features are likely to be placed. After applying the morphological operator, the system can then use the filtered inverse mask field to identify assist feature locations.

In some embodiments, the system terminates the iterative modification of the grayscale image before the cost function's value substantially reaches a minimum. Specifically, the system can terminate the iterative modification of the grayscale image after a fixed number of iterations, and/or terminate the iterative modification of the grayscale image once the contrast in the grayscale image is above a given threshold, and/or use some other criteria to determine when to terminate the iterative modification.

BRIEF DESCRIPTION OF THE FIGURES

Includes One or More Color Drawings

The patent or application file contains at least one drawing executed in color. Copies of this patent or patent application publication with color drawing(s) will be provided by the Office upon request and payment of the necessary fee.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
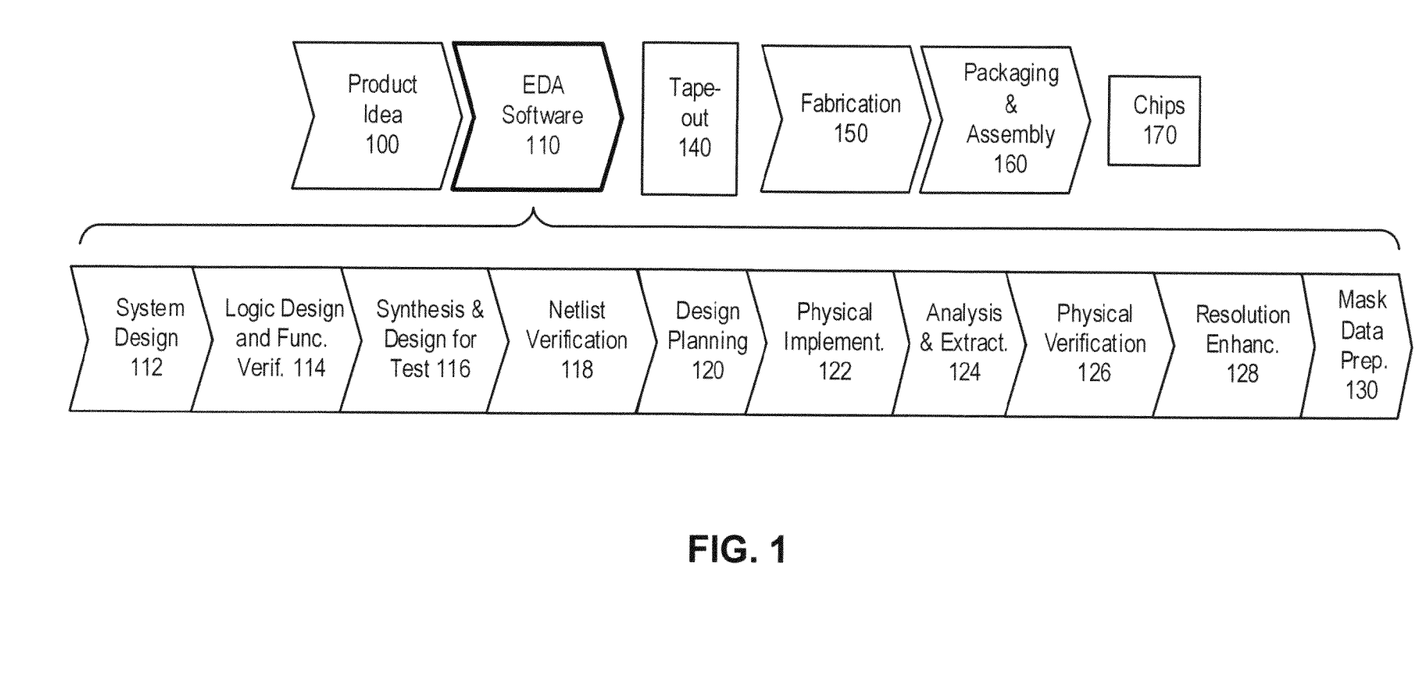
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCX™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Some embodiments can be used during one or more of the above-described steps. Specifically, some embodiments can be used during resolution enhancement (step 128).

Overview

At smaller technology nodes, rule-based assist feature (AF) placement is becoming increasingly complex and difficult to manage. This fact, along with the use of customized illumination elements, e.g., diffractive optical elements, calls for a model-based approach, which can efficiently explore the AF solution space, thereby achieving solutions not easily accessible using rules. Some embodiments of the present invention cast the AF placement problem as an inverse imaging problem. The goal in these embodiments is to synthesize a mask field, which images through the optical lithography system to produce a high contrast aerial image robust to dose and focus variation.

Inverse problems typically involve parameterizing the solution space using pixels. These pixels are typically very small (5-10 nm) which leads to an explosion in memory and processing requirements for full-chip applications. Indeed, one of the important questions is what are the theoretical and practical bounds on the pixelation for inverse-AF placement? Furthermore, the inverse-AF placement techniques should be fast and robust, preserve the symmetry in the solution, and handle features of all dimensions. Some embodiments of the present invention address all of the above concerns.

Inverse Lithography Technology (ILT)

The optical lithography image formation process can be written as follows:

$$z(x, y) = T\{m(x, y)\}$$

where $T\{.\}$ is the Hopkins imaging model, $m(x, y)$ is the input mask, and $z(x, y)$ is the output aerial image. Let $z^*(x, y)$ be the target layout. Although the example target mask layouts shown in the figures are for contacts, ILT can generally be used for any target mask layout with any arbitrary pattern. The model-based AF placement problem can be formulated as an inverse imaging problem. The goal of the inverse imaging problem is to estimate the mask $m(x, y)$ such that the resulting aerial image $T\{m(x, y)\}$ "closely" resembles the target $z^*(x, y)$. The "closeness" of the expected aerial image to the target image can be based on a distance metric between the two images.

There are numerous ways to formulate the inverse-imaging AF placement problem. Some embodiments formulate the inverse-image AF placement problem as an optimization problem with a cost function that indicates a difference between the target image and an aerial image. Specifically, in some embodiments, the cost function, $f$, is given by:

$$f(m(x, y)) = \|z^*(x, y) - T\{m(x,y)\}\|_2^2. \qquad (1)$$

The objective is to estimate the mask $m(x, y)$, which minimizes the $L_2$ norm of the distance between the output aerial image and the target. For dark field imaging, the target will have a maximum value (equal to 1) in the contact regions, zero in the background, and a high frequency transition from zero to one at all the contact boundaries. The inverse lithography technique attempts to find an aerial image that approximates the above (high contrast) target and automatically ends up placing assist features on the mask. Since the entire mask field is considered to be unknown, the primary and secondary AFs as well as the shared AFs are all synthesized in tandem, allowing correct-by-construction complex AF configurations. Depending on the desired goal, the cost function in Equation (1) can also be augmented to include more objectives like image log-slope maximization, AF printability compliance, OPC for contour fidelity, focus sensitivity minimization for better process window, etc. In other words, the present invention is not limited to using the cost function shown in Equation (1).

Some embodiments of the present invention use a pixel-based parameterization to solve the inverse-AF problem. In these embodiments, $m(x, y)$, $z^*(x, y)$, and $z(x, y)$ are sampled to obtain N×N discrete signals $M$, $Z^*$, and $Z$, respectively. Using the SOCS (sum of coherent systems) decomposition, the aerial image $Z$ is given as:

$$Z = \sum_{j=1}^{K} |H_j * M|^2, \quad (2)$$

where, $H_j$, $1 \leq j \leq K$, are the individual SOCS kernels, and the symbol "*" denotes mathematical 2-D convolution. The $L_2$ norm cost function shown in Equation (1) can now be rewritten as:

$$\hat{M} = \underset{M}{\operatorname{argmin}} F(M) = \underset{M}{\operatorname{argmin}} \|Z^* - Z\|^2 = \underset{M}{\operatorname{argmin}} \sum_{i=1}^{N \times N} (z_i^* - z_i)^2, \quad (3)$$

where "F" is the cost function, and $z_i$ can be computed using Equation (2). The optimization problem shown in Equation (3) can be solved using standard optimization techniques like gradient descent, conjugate gradient, quasi-Newton, etc. Note that since all the pixels in the aerial image contribute to the cost function, the problem of side-lobe printing is automatically avoided.

Conventional ILT-based techniques have a number of shortcomings. First, conventional techniques represent the target, $Z^*$, as a binary image. Therefore, conventional techniques natively handle only those features/pitches which are multiples of the sampling interval. This shortcoming is usually unacceptable in a practical setup. Second, conventional ILT-based techniques typically use a very fine pixelation of around 5-10 nm, which leads to explosion of memory, data, and computation requirements. Fundamental limits on the required pixelation for ILT-based techniques have not been explored. Third, ILT-based techniques typically involve performing the optimization (with or without regularization) until the optimization solution converges to a binary mask. Unfortunately, each iteration in the optimization can be thrice as expensive as a forward model evaluation, and hence, the optimization can require a large amount of computation. Fourth, conventional ILT-based techniques typically use field-based simulations, which have symmetry-related issues introduced by sampling and aliasing. In other words, the AF placement generated by conventional ILT-based techniques are typically not symmetrical, which is undesirable.

Analytic Gradient

Inverse lithography techniques usually employ the gradient of the cost function in order to effectively navigate the solution space. The gradient can be calculated analytically instead of numerically. If we assume that the cost function is represented using an N×N matrix, the computational complexity for computing the gradient of the cost function is $O(N^2)$. However, note that the computational complexity of an analytical computation of the gradient is $O(N \log N)$. Hence, using an analytical computation of the gradient can substantially reduce the amount of computation required to compute the gradient. The analytic gradient of the cost function in Equation (3) with respect to the unknown parameter (individual mask pixels) is given by:

$$\nabla F(M) = H^T \cdot ((Z^* - Z) \cdot (H * M)) \in N \times N. \quad (4)$$

The gradient of the cost function shown in Equation (4) can now be used in conjunction with steepest descent, conjugate gradient, quasi-Newton, or any optimization strategy to arrive at the optimum mask solution. Note that every pixel $m_i$ represents the mask transmission value, which is dependent on the RET technology (binary, EPSM, CPL, etc). Therefore, the optimization problem is subject to bound constraints, and can be solved by using either parametric transformation or gradient-projection techniques.

ILT-based techniques typically use a binary image to represent the target layout. Therefore, only those features whose size is an exact multiple of the sampling interval $T_s$, can be accurately represented with zero error. The remaining features will have an error up to $T_s/2$, which is a fundamental limitation that is inherent to the binary representation.

In contrast to conventional ILT-based techniques, some embodiments of the present invention anti-alias the layout and use a grayscale representation instead of a binary representation. Note that, in Equation (2), the aerial image $Z$ can only have frequencies up to $2 \cdot b$, where b is the optical bandwidth which is equal to $(NA \cdot (1+\sigma))/\lambda$, where NA is the numerical aperture, $\sigma$ is the partial coherence factor, and $\lambda$ is the wavelength of the source in the optical system. Thus, frequencies greater than $2 \cdot b$ in the target mask layout $Z^*$ will never be matched, and can be dropped without affecting the accuracy of the computation that determines AF locations.

Accordingly, in some embodiments, the target layout $z^*(x, y)$ is first band-limited using a low pass filter with cut-off frequency $2 \cdot b$, and then sampled to obtain a grayscale image $Z^*$. Note that the cost function in Equation (2) is now trying to match two signals of potentially equivalent frequency information. As mentioned earlier, an advantage of representing the target mask layout as a grayscale image is that the features need not be multiples of the sampling interval any longer. In other words, some embodiments of the present invention accurately represent pitches and features of any dimension because they represent the target mask layout using a grayscale image instead of a binary image.

Note that anti-aliasing a binary image is not obvious because it blurs the image and because it can increase the memory storage requirements for the image. By definition, anti-aliasing removes high-frequency components in the figure. Specifically, anti-aliasing blurs the perfect contrast at the pattern edges. Generally, it would be undesirable to blur an image because the blurred image is only an approximation of the perfect binary image. Further, a binary image can be represented using one bit per pixel. However, a grayscale image requires multiple bits to represent each pixel. Specifically, some embodiments of the present invention use at least eight bits to represent the intensity of each pixel. Hence, it is not obvious to anti-alias a binary image.

Theoretical Bound on the Pixel Size

An anti-aliased target mask layout enables the possibility of using a much coarser pixelation instead of the typically employed 5-10 nm sampling. This, in turn, reduces the number of templates and the runtime. Some embodiments of the present invention are based on the following insight: the theoretical limit of pixelation is dictated by the fact that the gradient field calculated using Equation (4) should be aliasing free.

Equation (4) indicates that the gradient calculation involves the following steps:
 i. Convolution of the mask with the optical filter (bandwidth=b).
 ii. Calculation of the aerial image Z (bandwidth=2·b).
 iii. Element by element spatial multiplication of $(Z^*-Z)$ with the electric field computed from step (i). The result of the multiplication can have a spatial bandwidth up to 3·b.
 iv. Convolution of the field computed in step (iii) with the filter H which has a bandwidth of b.

Note that the maximum bandwidth that appears in the gradient calculation is 3·b in step (iii). Therefore, one might assume that the Nyquist rate for gradient evaluation is equal to 6·b. However, some embodiments of the present invention are based on the following insight: a sampling frequency of 4·b can ensure that the gradient of the cost function is aliasing free.

Figure 2:
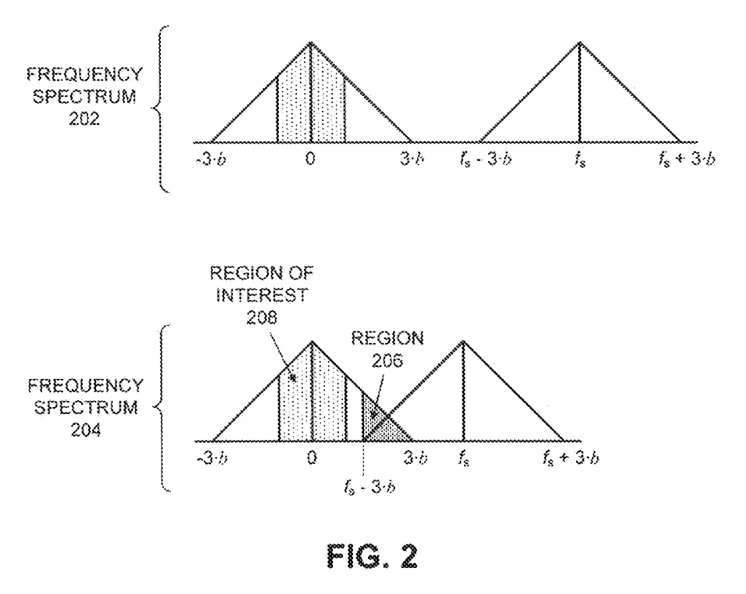
FIG. 2 illustrates the frequency spectrum of the intermediate field $(Z^*-Z) \cdot (H^*M)$ for two different sampling frequencies in accordance with an embodiment of the present invention.

FIG. 2 illustrates the frequency spectrum of the intermediate field $(Z^*-Z)\cdot(H^*M)$ for two different sampling frequencies in accordance with an embodiment of the present invention. Note that the intermediate field is the field that results after step (iii) in the gradient calculation.

Frequency spectrum 202 is for the case when the sampling frequency is greater than two times the maximum bandwidth, i.e., the sampling frequency $f_s>6\cdot b$. Note that, at this sampling frequency, there is no aliasing.

Frequency spectrum 204 is for the case when the sampling frequency is lower than 6·b, which causes the higher frequency components to overlap in region 206. This, of course, introduces aliasing in the frequency components that lie between $f_s-3\cdot b$ and 3·b.

Some embodiments of the present invention are based on the following insight: since the last step in gradient calculation is a convolution, we really only care for the lower frequencies between 0 to b. Hence, even though the higher frequency components of the intermediate field are corrupted by aliasing, our "region of interest" 208 will remain clean (and aliasing free) as long as $f_s-3\cdot b>b$, i.e., as long as $f_s>4\cdot b$. In other words, the sampling frequency has to be greater than 4·b (instead of 6·b) to ensure that the gradient of the cost function is aliasing free.

Note that the size of the discretized fields depends on the sampling frequency (or the granularity of the pixelation). Specifically, the size of the discretized fields increases as the square of the sampling frequency. On the other hand, increasing the sampling frequency can improve the accuracy of the solution to the optimization problem. Hence, there is generally a tradeoff between the accuracy of the optimization solution and the amount of computation required for determining the solution. However, as explained above, some embodiments of the present invention are based on the following insight: if the sampling frequency is chosen so that it prevents aliasing of the gradient of the cost function, then the AF-placement can be performed quickly and accurately. Specifically, the above-described insights enable embodiments of the present invention to use a sampling frequency of 4·b instead of a sampling frequency of 6·b, thereby substantially speeding up the computation of the inverse field without sacrificing accuracy.

As mentioned above, the sampling frequency determines the pixelation granularity. Reducing the sampling size from 6·b to 4·b enables the system to use larger pixels while performing the gradient calculations. For example, for an optical system with NA=1.1, $\sigma$=0.75, and $\lambda$=193 nm, some embodiments of the present invention compute the inverse mask layout using a pixel size of $1/(4\times b)=193/(4\times 1.1\times 1.75)=25$ nm, which is significantly larger than the pixel sizes that conventional ILT-based techniques use. Note that the 4·b bound was based on the gradient calculation of the cost function shown in Equation (1). A different cost function may have a different bound. However, the insight that the sampling frequency should be chosen so that it ensures that the gradient of the cost function is aliasing free is applicable to any cost function. Regardless of what cost function is used, this insight enables the inverse mask layout to be computed using a larger pixel size than would have been possible in the absence of the insight.

AF Placement and Cleanup

Some embodiments of the present invention require substantially fewer iterations to determine the inverse mask field than the conventional ILT-based techniques. Conventional ILT-based techniques perform several iterations until the solution converges to a binary or a two-tone solution. This leads to an increase in the amount of time and computational resources required to achieve the final ILT solution. In contrast to conventional ILT-based techniques, some embodiments of the present invention use substantially fewer iterations to obtain a high-contrast (grayscale) inverse AF mask field.

Figure 3:
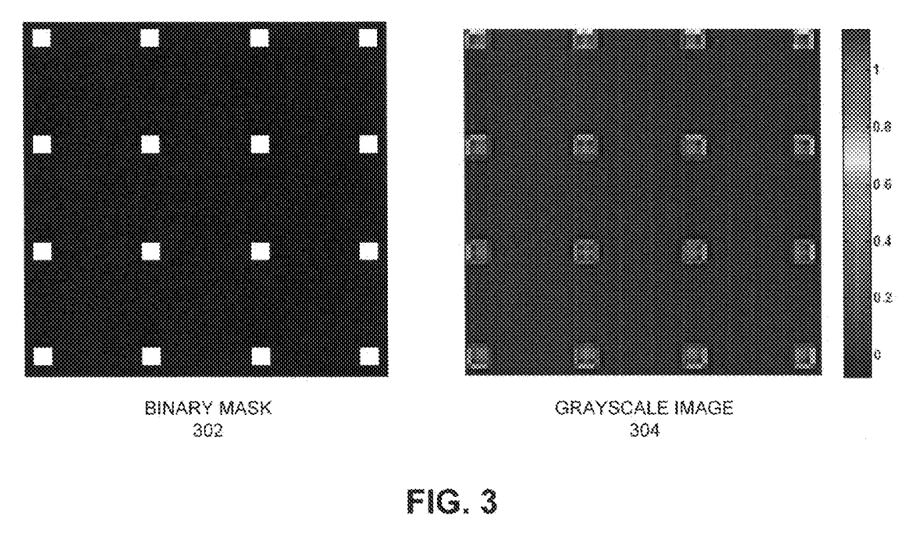
FIG. 3 illustrates a binary mask and a corresponding grayscale image in accordance with an embodiment of the present invention.

FIG. 3 illustrates a binary mask and a corresponding grayscale image in accordance with an embodiment of the present invention.

Binary mask 302 represents a portion of a mask layout that is used for creating contacts in a chip. The white squares in binary mask 302 correspond to a train of contacts with size 60 nm and pitch 360 nm. When binary mask 302 is converted into an anti-aliased grayscale image, we obtain grayscale image 304. As explained above, some embodiments of the present invention perform anti-aliasing using a frequency that ensures that the gradient of the cost function that will be used during optimization is aliasing free. In the particular example shown in FIG. 3, a sampling interval of 17 nm was chosen. Note that even though all contacts have the same size, the contact pixels may appear different due to the offset in the sampling grid.

Note that different shades of gray in grayscale image 304 are represented using different colors for the sake of clarity. The legend on the right side of grayscale image 304 indicates the mapping between each color and the grayscale intensity. For example, the blue regions in grayscale image 304 correspond to pixels whose value is substantially equal to 0, whereas the red areas in grayscale image 304 correspond to pixels whose value is substantially equal to 1.

Figure 4:
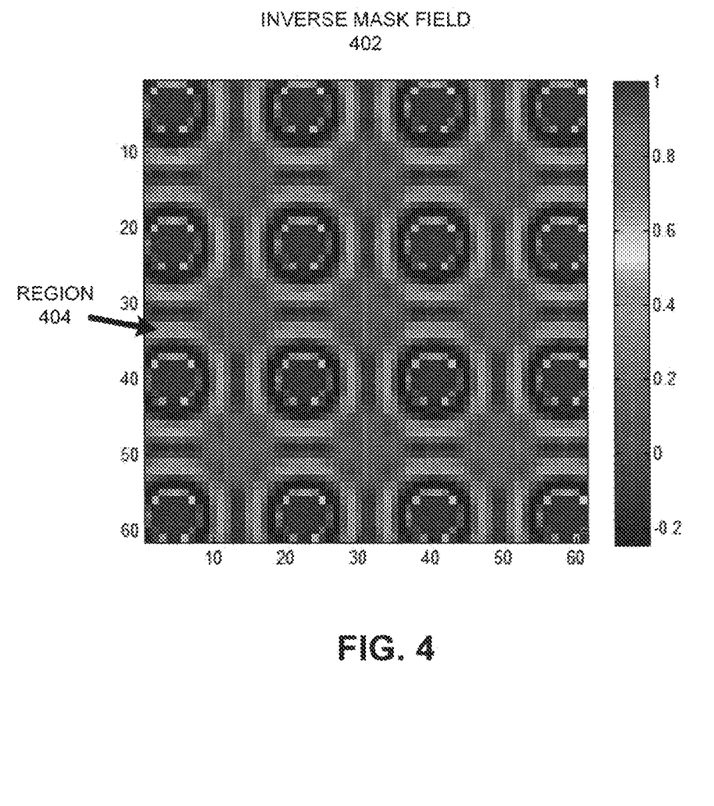
FIG. 4 illustrates an inverse mask field after eight iterations in accordance with an embodiment of the present invention.

FIG. 4 illustrates the inverse mask field after eight iterations in accordance with an embodiment of the present invention.

Once an anti-aliased grayscale image is obtained from the target mask layout, the system can iteratively modify the grayscale image based on the gradient of the cost function. After eight iterations, the modified grayscale image may result in inverse mask field 402.

At the beginning of the iterative process which modifies the grayscale image, the background can be set to zero. Note that AF locations are already beginning to show up in the form of high intensity regions, e.g., region 404, and the mask has good contrast. The regions of the inverse mask field where assist features will be placed now have positive transmission values. There are also dark regions with negative transmission values. These regions were initialized to zero at the beginning of the iterative process, but after eight iterations their negative value clearly indicates that assist features should not be placed at these regions. Thus, we have a clear demarcation of the AF regions. The task of extracting the AF polygon is much easier now, with fewer chances of picking up false (error) maxima or minima as an AF region. A true AF valley will be comparatively deeper than a random sampling error noise.

More iterations of the optimization process are expected to reinforce these AF regions and eventually result in an inverse mask field which minimizes the cost function's value. Conventional ILT-based techniques typically perform iterations till the cost function's value substantially reaches a minimum. However, iterations are computationally very expensive. In contrast to conventional ILT-based techniques, some embodiments of the present invention terminate the iterative process before the cost function's value substantially reaches a minimum. Specifically, some embodiments of the present invention can terminate the optimization process after a predetermined number of iterations have been performed. Alternatively, some embodiments may terminate the optimization process after the contrast in the inverse mask field becomes greater than a user-defined threshold. In yet another embodiment, the embodiment may terminate the optimization process if the incremental change in the cost function's value from the last iteration is less than a user-defined threshold. Note that conventional ILT-based techniques typically use regularization (e.g., penalty functions) to enforce tone constraints and obtain binary looking masks during the optimization process. In contrast, some embodiments of the present invention terminate the iterative optimization process early and do not employ regularization for tone enforcement. In the example shown in FIG. 4, the system may terminate the optimization process after eight iterations, and use the inverse mask field 402 to identify AF locations.

Conventional ILT-based techniques use field-based models which are well known to suffer from asymmetry issues introduced by the sampling noise. The asymmetry affects the synthesized inverse mask field because it can create multiple local maxima in the inverse mask field. If an inverse mask field that contains multiple local maxima is directly used to make AF placement decisions, it can lead to asymmetric assist feature placements, which is undesirable. To overcome the asymmetry problem, some embodiments of the present invention use a morphological operator, e.g., the h-maxima operator, as a pre-processing step to the polygon placement process. The morphological operator, e.g., the h-maxima operator, suppresses all maxima in the mask field whose height is less than a user-defined value. Noise and sampling errors typically appear in the form of narrow bumps in the mask field. In conventional techniques that use an intensity field to identify assist feature locations, these narrow bumps are mistaken as one or more assist feature valleys. In contrast to such conventional techniques, some embodiments of the present invention use the morphological operator to flatten the narrow bumps in an inverse mask field so that the system places a single large assist feature at the location, instead of placing multiple small assist features.

Figure 5:
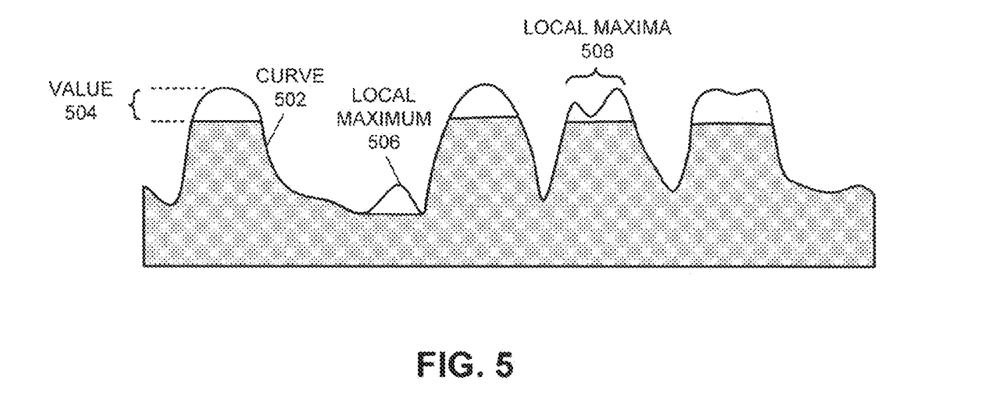
FIG. 5 illustrates how a morphological operator can be applied to an inverse mask field in accordance with an embodiment of the present invention.

FIG. 5 illustrates how a morphological operator can be applied to the inverse mask field in accordance with an embodiment of the present invention.

Curve 502 represents the grayscale value in an inverse mask field along a line in the inverse mask field. The local maxima in curve 502 correspond to potential assist feature locations. Some embodiments of the present invention use an h-maxima operator to filter out local maxima where assist features should not be placed, and coalesce local maxima where a single assist feature should be placed. For example, when an h-maxima operator is applied to the inverse mask field, it can flatten all maxima in the inverse mask field by reducing the height of the maxima by value 504. The shaded region in FIG. 5 corresponds to the output of the h-maxima operator. Note that local maximum 506 is filtered out, and local maxima 508 are coalesced into a single maximum.

The inverse mask field iterations can ensure that the true assist feature bumps are sufficiently boosted and are higher compared to the false "error" bumps. The inverse mask field has a much better contrast compared to the contact intensity field. This combination of high contrast and h-maxima leads to a very robust symmetric placement of assist features. Another advantage of using the inverse mask field is that the background area where it is not preferable to place an assist feature is very clearly distinguishable.

Based on the above discussion, the following sections describe systems and techniques for identifying locations for placing assist features.

Process for Identifying Locations for Placing Assist Features

Figure 6:
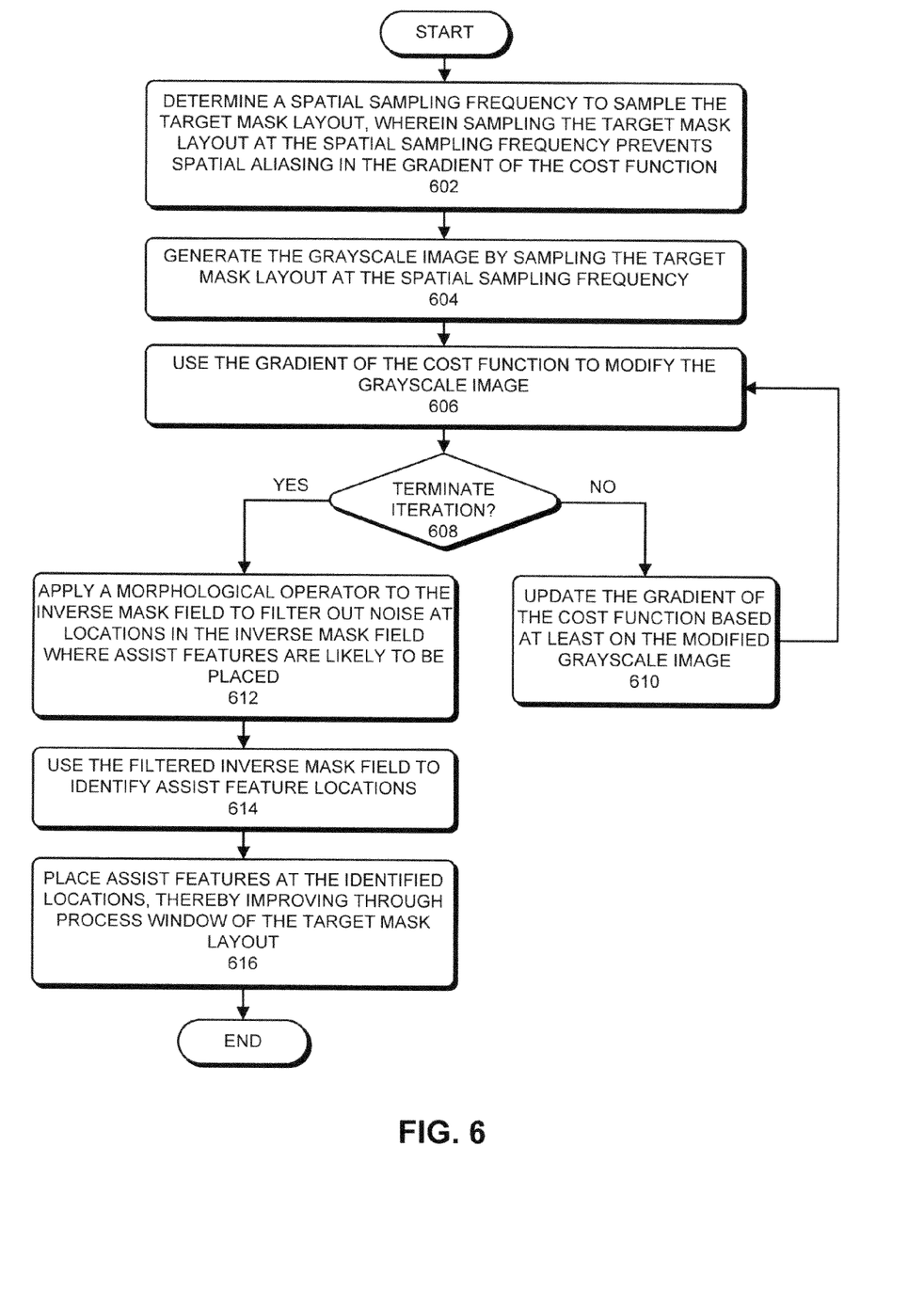
FIG. 6 presents a flowchart that illustrates a process for identifying locations for placing assist features in accordance with an embodiment of the present invention.

FIG. 6 presents a flowchart that illustrates a process for identifying locations for placing assist features in accordance with an embodiment of the present invention.

A system can use the process to identify assist feature locations based on an inverse mask field which is determined by iteratively modifying a grayscale image that represents a target mask layout. The system can iteratively modify the grayscale image based on the value of a gradient of a cost function. The cost function can indicate a difference between the target mask layout and an aerial image that would be formed by the inverse mask field.

Specifically, the process can begin by determining a spatial sampling frequency to sample the target mask layout, wherein sampling the target mask layout at the spatial sampling frequency prevents spatial aliasing in the gradient of the cost function (block 602).

Next, the system can generate the grayscale image by sampling the target mask layout at the spatial sampling frequency (block 604). The grayscale image can be obtained by applying an anti-aliasing filter to the binary image, wherein the anti-aliasing filter's bandwidth is selected to prevent spatial aliasing in the gradient of the cost function.

The system can then compute the inverse mask field by, iteratively, using the gradient of the cost function to modify the grayscale image, and updating the gradient of the cost function based at least on the modified grayscale image.

Specifically, the system can use the gradient of the cost function to modify the grayscale image (block 606). For example, the system can perform one iteration of the optimization process using the gradient of the cost function. Note that, in each iteration of the optimization process, the system can modify the grayscale image so that the value of the cost function for the modified grayscale image is closer to an optimum value.

Next, the system can determine whether to terminate the iterative process (block 608). As explained above, in some embodiments, the system can terminate the iterative modification of the grayscale image before the cost function's value substantially reaches a minimum. Specifically, the system can terminate the iterative modification of the grayscale image after a fixed number of iterations. Further, the system can terminate the iterative modification of the grayscale image once the contrast in the grayscale image is above a given threshold.

If the system determines that more iterations are required, the system can update the gradient of the cost function based at least on the modified grayscale image (block 610).

On the other hand, if the system determines that the iterative process should be terminated, the system can terminate the iterative process, and identify locations for placing assist features based at least on the inverse mask field. Note that, when the optimization process terminates, the resulting grayscale image can be used as the inverse mask field.

Specifically, in some embodiments, the system can apply a morphological operator to the inverse mask field to filter out noise at locations in the inverse mask field where assist features are likely to be placed (block 612). Exemplary morphological operators include, but are not limited to, an h-maxima operator and an h-minima operator. Next, the system can use the filtered inverse mask field to identify assist feature locations (block 614).

Once the assist feature locations have been identified, the system can place assist features at the identified locations, thereby improving through process window of the target mask layout (block 616).

Computer System and Apparatus

Figure 7:
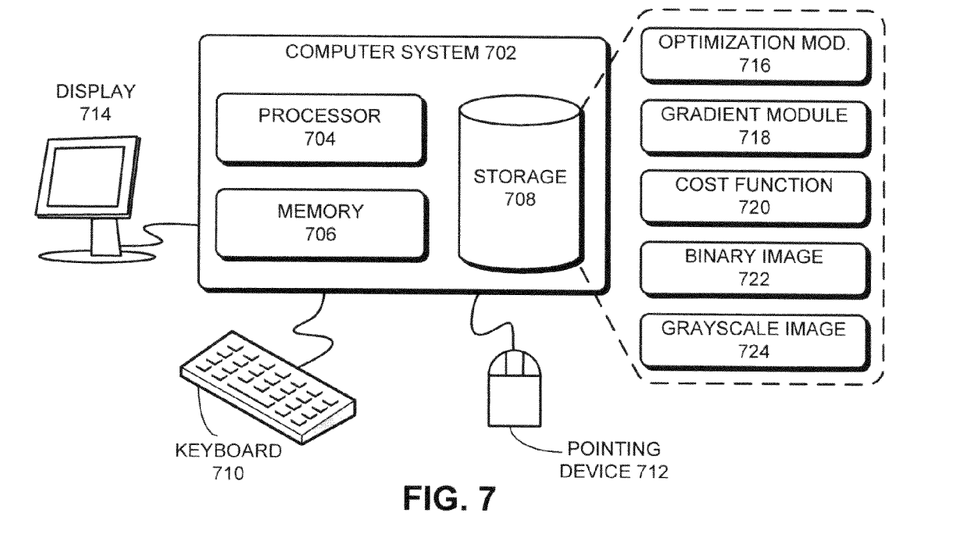
FIG. 7 illustrates a computer system in accordance with an embodiment of the present invention.

FIG. 7 illustrates a computer system in accordance with an embodiment of the present invention.

Computer system 702 comprises processor 704, memory 706, and storage 708. Computer system 702 can be coupled with display 714, keyboard 710, and pointing device 712. Storage 708 can store instructions and/or data that when processed by processor 704 can cause computer system 702 to identify assist feature locations by computing an inverse mask field.

Specifically, storage 708 can store optimization module 716, gradient module 718, cost function 720, binary image 722, and grayscale image 724. During operation, binary image 722 can be converted into anti-aliased grayscale image 724. Optimization module 716 can use gradient module 718 to compute the gradient of cost function 720 to iteratively modify grayscale image 724. The modules shown in FIG. 7 are for illustrative purposes only and are not intended to limit the invention to the forms disclosed.

Figure 8:
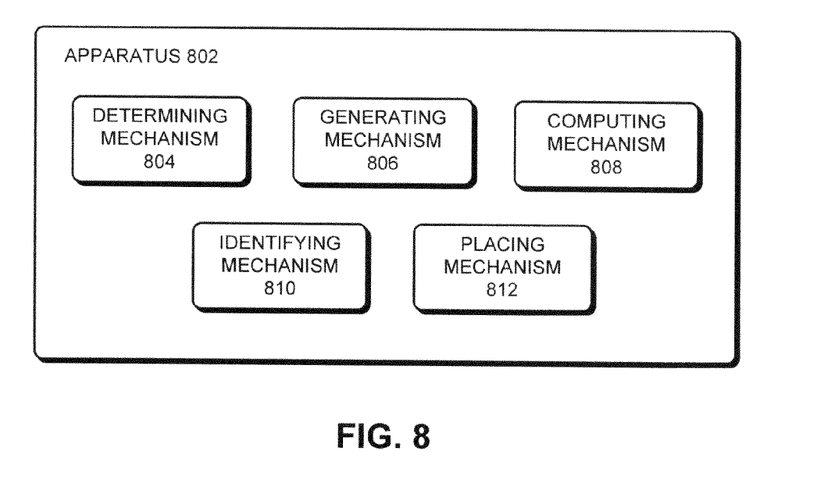
FIG. 8 illustrates an apparatus in accordance with an embodiment of the present invention.

FIG. 8 illustrates an apparatus in accordance with an embodiment of the present invention.

Apparatus 802 can comprise a number of mechanisms which may communicate with one another via a wired or wireless communication channel. Specifically, apparatus 802 can comprise determining mechanism 804, generating mechanism 806, computing mechanism 808, identifying mechanism 810, and placing mechanism 812. In some embodiments, determining mechanism 804 can be configured to determine a spatial sampling frequency to sample the target mask layout, wherein sampling the target mask layout at the spatial sampling frequency prevents spatial aliasing in the gradient of the cost function; generating mechanism 806 can be configured to generate a grayscale image by sampling the target mask layout at the spatial sampling frequency; computing mechanism 808 can be configured to compute an inverse mask field; identifying mechanism 810 can be configured to identify locations for placing assist features based at least on the inverse mask field; and placing mechanism 812 can be configured to place assist features at the identified locations, thereby improving through process window of the target mask layout.

Apparatus 802 can be part of a computer system or be a separate device which is capable of communicating with other computer systems and/or devices. Apparatus 802 may be realized using one or more integrated circuits. Specifically, one or more mechanisms in apparatus 802 can be implemented as part of a processor.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to identify locations for placing assist features using a computer, wherein the locations are identified using an inverse mask field, wherein the inverse mask field is determined by iteratively modifying a grayscale image that represents a target mask layout, and wherein the iterative modifications to the grayscale image are performed using a gradient of a cost function, the method comprising:
   determining a spatial sampling frequency to sample the target mask layout, wherein sampling the target mask layout at the spatial sampling frequency prevents spatial aliasing in the gradient of the cost function;
   generating the grayscale image by sampling the target mask layout at the spatial sampling frequency;
   computing the inverse mask field by, iteratively,
      using the gradient of the cost function to modify the grayscale image, and
      updating the gradient of the cost function based at least on the modified grayscale image; and
   identifying locations for placing assist features based at least on the inverse mask field.

2. The method of claim 1, wherein computing the inverse mask field includes terminating the iterative modification of the grayscale image before the cost function's value substantially reaches a minimum.

3. The method of claim 1, wherein computing the inverse mask field includes terminating the iterative modification of the grayscale image after a fixed number of iterations.

4. The method of claim 1, wherein computing the inverse mask field includes terminating the iterative modification of the grayscale image once the contrast in the grayscale image is above a given threshold.

5. The method of claim 1, wherein the spatial sampling frequency is greater than or equal to $4 \cdot ((NA \cdot (1+\sigma))/\lambda)$ where NA is the numerical aperture, $\sigma$ is the partial coherence factor, and $\lambda$ is the wavelength.

6. The method of claim 1, further comprising placing assist features at the identified locations, thereby improving through process window of the target mask layout.

7. The method of claim 1, wherein the cost function indicates a difference between the target mask layout and an aerial image that would be formed by the inverse mask field.

8. The method of claim 1, further comprising applying a morphological operator to the inverse mask field to filter out noise at locations in the inverse mask field where assist features are likely to be placed.

9. The method of claim 8, wherein the morphological operator is one of: an h-maxima operator, or an h-minima operator.

10. A non-transitory computer-readable storage medium storing instructions that when executed by a computer cause the computer to perform a method to identify locations for placing assist features, wherein the locations are identified using an inverse mask field, wherein the inverse mask field is determined by iteratively modifying a grayscale image that represents a target mask layout, and wherein the iterative modifications to the grayscale image are performed using a gradient of a cost function, the method comprising:
   determining a spatial sampling frequency to sample the target mask layout, wherein sampling the target mask layout at the spatial sampling frequency prevents spatial aliasing in the gradient of the cost function;
   generating the grayscale image by sampling the target mask layout at the spatial sampling frequency;
   computing the inverse mask field by, iteratively,
      using the gradient of the cost function to modify the grayscale image, and
      updating the gradient of the cost function based at least on the modified grayscale image; and
   identifying locations for placing assist features based at least on the inverse mask field.

11. The non-transitory computer-readable storage medium of claim 10, wherein computing the inverse mask field includes terminating the iterative modification of the grayscale image before the cost function's value substantially reaches a minimum.

12. The non-transitory computer-readable storage medium of claim 10, wherein computing the inverse mask field includes terminating the iterative modification of the grayscale image after a fixed number of iterations.

13. The non-transitory computer-readable storage medium of claim 10, wherein computing the inverse mask field includes terminating the iterative modification of the grayscale image once the contrast in the grayscale image is above a given threshold.

14. The non-transitory computer-readable storage medium of claim 10, wherein the spatial sampling frequency is greater than or equal to $4 \cdot ((NA \cdot (1+\sigma))/\lambda)$, where NA is the numerical aperture, $\sigma$ is the partial coherence factor, and $\lambda$ is the wavelength.

15. The non-transitory computer-readable storage medium of claim 10, further comprising placing assist features at the identified locations, thereby improving through process window of the target mask layout.

16. The non-transitory computer-readable storage medium of claim 10, wherein the cost function indicates a difference between the target mask layout and an aerial image that would be formed by the inverse mask field.

17. The non-transitory computer-readable storage medium of claim 10, further comprising applying a morphological operator to the inverse mask field to filter out noise at locations in the inverse mask field where assist features are likely to be placed.

18. The non-transitory computer-readable storage medium of claim 17, wherein the morphological operator is one of: an h-maxima operator, or an h-minima operator.

19. An apparatus to identify locations for placing assist features, wherein the locations are identified using an inverse mask field, wherein the inverse mask field is determined by iteratively modifying a grayscale image that represents a target mask layout, and wherein the iterative modifications to the grayscale image are performed using a gradient of a cost function, the method comprising:
   a determining mechanism configured to determine a spatial sampling frequency to sample the target mask layout, wherein sampling the target mask layout at the spatial sampling frequency prevents spatial aliasing in the gradient of the cost function;
   a generating mechanism configured to generate the grayscale image by sampling the target mask layout at the spatial sampling frequency;
   a computing mechanism configured to compute the inverse mask field by, iteratively,
      using the gradient of the cost function to modify the grayscale image, and
      updating the gradient of the cost function based at least on the modified grayscale image; and
   an identifying mechanism configured to identify locations for placing assist features based at least on the inverse mask field.

20. The apparatus of claim 19, further comprising a placing mechanism configured to place assist features at the identified locations, thereby improving through process window of the target mask layout.

21. The apparatus of claim 19, further comprising an applying mechanism configured to apply a morphological operator to the inverse mask field to filter out noise at locations in the inverse mask field where assist features are likely to be placed.

* * * * *

UNITED STATES PATENT AND TRADEMARK OFFICE
CERTIFICATE OF CORRECTION

PATENT NO.        : 8,010,913 B2                          Page 1 of 1
APPLICATION NO.   : 12/386199
DATED             : August 30, 2011
INVENTOR(S)       : Amyn A. Poonawala et al.

It is certified that error appears in the above-identified patent and that said Letters Patent is hereby corrected as shown below:

Title page, item [73] of the patent, in the Assignee name, please replace the word Moountain" with --Mountain--.

Signed and Sealed this
Twenty-second Day of November, 2011

David J. Kappos
*Director of the United States Patent and Trademark Office*